(12) United States Patent
Watanabe et al.

(10) Patent No.: US 8,375,340 B2
(45) Date of Patent: Feb. 12, 2013

(54) APPARATUS FOR MANUFACTURING SUBSTRATE FOR TESTING, METHOD FOR MANUFACTURING SUBSTRATE FOR TESTING AND RECORDING MEDIUM

(75) Inventors: Daisuke Watanabe, Saitama (JP); Masakatsu Suda, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 10 days.

(21) Appl. No.: 12/952,112

(22) Filed: Nov. 22, 2010

(65) Prior Publication Data

US 2011/0125308 A1    May 26, 2011

Related U.S. Application Data

(63) Continuation of application No. PCT/JP2008/059948, filed on May 29, 2008.

(51) Int. Cl.
*G06F 17/50* (2006.01)
(52) U.S. Cl. .................................................. 716/110
(58) Field of Classification Search .............. 716/100, 716/110
See application file for complete search history.

(56) References Cited

U.S. PATENT DOCUMENTS

| 5,898,595 | A | 4/1999 | Bair et al. |
| 7,594,149 | B2* | 9/2009 | Pilling ........................ 714/726 |
| 2004/0175850 | A1* | 9/2004 | Shimizu et al. .............. 438/14 |
| 2006/0190790 | A1* | 8/2006 | Pilling et al. ................ 714/734 |
| 2007/0236232 | A1* | 10/2007 | Aghababazadeh et al. ... 324/751 |
| 2008/0100319 | A1* | 5/2008 | Aghababazadeh et al. ... 324/754 |
| 2009/0037131 | A1* | 2/2009 | Hess et al. ................... 702/117 |
| 2009/0184725 | A1* | 7/2009 | Tunaboylu .................. 324/754 |
| 2010/0237891 | A1* | 9/2010 | Lin et al. ..................... 324/763 |
| 2010/0311192 | A1* | 12/2010 | Pan et al. .................... 438/17 |
| 2011/0006794 | A1* | 1/2011 | Sellathamby et al. ... 324/754.03 |

FOREIGN PATENT DOCUMENTS

| JP | 7-263560 | A | 10/1995 |
| JP | 11-505943 | A | 5/1999 |
| JP | 2001-308259 | A | 11/2001 |
| JP | 2002-222839 | A | 8/2002 |
| TW | 530360 | | 5/2003 |

OTHER PUBLICATIONS

International Search Report (ISR) issued in PCT/JP2008/059948 (parent application) mailed in Aug. 2008 for Examiner consideration.
Written Opinion (PCT/ISA/237) issued in PCT/JP2008/059948 (parent application) mailed in Aug. 2008.
TW Office Action/ Search Report and English Translation Dated Sep. 28, 2012; Application No. 098117777.

* cited by examiner

Primary Examiner — Suchin Parihar

(57) ABSTRACT

A test substrate manufacturing apparatus comprising a test circuit database that stores circuit data of a plurality of types of test circuits in association with a plurality of types of testing content; a definition information storing section that stores definition information defining arrangements of device pads of devices under test and testing content to be performed for each of the device pads; and a lithography data generating section that generates lithography data for the test substrate by (i) selecting, from the test circuit database, circuit data of each test circuit to be connected to a device pad based on the testing content defined by the definition information stored in the definition information storing section and (ii) determining positions on the test substrate where the test circuits corresponding to the selected circuit data are formed using lithography, based on the arrangements of the device pads as defined by the definition information.

16 Claims, 8 Drawing Sheets

APPARATUS FOR MANUFACTURING SUBSTRATE FOR TESTING, METHOD FOR MANUFACTURING SUBSTRATE FOR TESTING AND RECORDING MEDIUM

BACKGROUND

1. Technical Field

The present invention relates to a test substrate manufacturing apparatus, a method for manufacturing a test substrate, and a recording medium. In particular, the present invention relates to a test substrate manufacturing apparatus for manufacturing a test substrate that tests a plurality of devices under test formed on a wafer under test, a method for manufacturing the test substrate, and a recording medium that stores a program causing the test substrate manufacturing apparatus to function.

2. Related Art

For testing semiconductor chips, an apparatus is known that tests pass/fail of each of a plurality of semiconductor chips formed on a semiconductor wafer, as shown in, for example, Japanese Patent Application Publication No. 2002-222839. This apparatus includes a probe card that can be electrically connected to a plurality of semiconductor chips en bloc.

The test apparatus includes a channel corresponding to each terminal of a semiconductor chip. A test circuit is provided for each channel, and the semiconductor chip is tested by the test circuit exchanging signals with each terminal of the semiconductor chip. In order to enable testing of a variety of semiconductor chips, each channel is provided with a general test circuit that can perform a variety of tests. A general test circuit having a variety of functions is relatively large, and so the total area of the test circuits increases when a general test circuit is provided for each channel. As a result, the test substrate on which the general test circuits are formed is housed in a large chassis such as a test head and is electrically connected to the device under test via a cable and probe card, for example.

Usually, when the signal transmission distance between a test circuit and a device under test is great, it is difficult to perform accurate testing of the device under test due to transmission loss. Therefore, in order to decrease the signal transmission distance between the device under test and the test circuit, the test circuit is provided on a probe card or on a substrate adjacent to the probe card. However, the probe card or the substrate adjacent to the probe card has a limited space in which test circuits can be formed, and so it is difficult to provide a general test circuit for each channel.

Furthermore, a BIST circuit can be provided in the device under test to decrease the size of the test circuits. With this technique, however, a circuit that is not used during actual operation is formed in the semiconductor chip, and this decreases the area in the semiconductor chip in which circuits for actual operation can be formed.

Therefore, it is an object of the present invention to provide a test substrate manufacturing apparatus, a method of manufacturing a test substrate, and a program, which are capable of overcoming the above drawbacks accompanying the related art. The above and other objects can be achieved by combinations described in the independent claims. The dependent claims define further advantageous and exemplary combinations of the innovations herein.

SUMMARY

Therefore, it is an object of an aspect of the innovations herein to provide a test substrate manufacturing apparatus, a method of manufacturing a test substrate, and a program, which are capable of overcoming the above drawbacks accompanying the related art. This object can be achieved by combinations described in the independent claims. According to a first aspect related to the innovations herein, provided is a test substrate manufacturing apparatus for manufacturing a test substrate on which are formed a plurality of test circuits that test a plurality of devices under test formed on a wafer under test, the test substrate manufacturing apparatus comprising a test circuit database that stores circuit data of the plurality of test circuits in association with a plurality of types of testing content; a definition information storing section that stores definition information defining arrangements of device pads of the devices under test and testing content to be performed for each of the device pads; and a lithography data generating section that generates lithography data for the test substrate by (i) selecting, from the test circuit database, circuit data of each test circuit to be connected to a device pad based on the testing content defined by the definition information stored in the definition information storing section and (ii) determining positions on the test substrate where the test circuits corresponding to the selected circuit data are formed using lithography, based on the arrangements of the device pads as defined by the definition information.

According to a second aspect related to the innovations herein, provided is a method for manufacturing a test substrate on which are formed a plurality of test circuits that test a plurality of devices under test formed on a wafer under test. This method comprises storing, in a test circuit database, circuit data of the plurality of test circuits in association with a plurality of types of testing content; storing, in a definition information storing section, definition information defining arrangements of device pads of the devices under test and testing content to be performed for each of the device pads; generating lithography data for the test substrate by (i) selecting, from the test circuit database, circuit data of each test circuit to be connected to a device pad based on the testing content defined by the definition information stored in the definition information storing section and (ii) determining positions on the test substrate where the test circuits corresponding to the selected circuit data are formed using lithography, based on the arrangements of the device pads as defined by the definition information; and manufacturing the test substrate by performing electron beam lithography on a semiconductor wafer based on the generated lithography data.

According to a third aspect related to the innovations herein, provided is a recording medium storing thereon a program that causes a computer to function as a test substrate manufacturing apparatus for manufacturing a test substrate on which are formed a plurality of test circuits that test a plurality of devices under test formed on a wafer under test. This program causes the computer to function as a test circuit database that stores circuit data of the plurality of test circuits in association with a plurality of types of testing content; a definition information storing section that stores definition information defining arrangements of device pads of the devices under test and testing content to be performed for each of the device pads; and a lithography data generating section that generates lithography data for the test substrate by (i) selecting, from the test circuit database, circuit data of each test circuit to be connected to a device pad based on the testing content defined by the definition information stored in the definition information storing section and (ii) determining positions on the test substrate where the test circuits corresponding to the selected circuit data are formed using lithography, based on the arrangements of the device pads as defined by the definition information.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
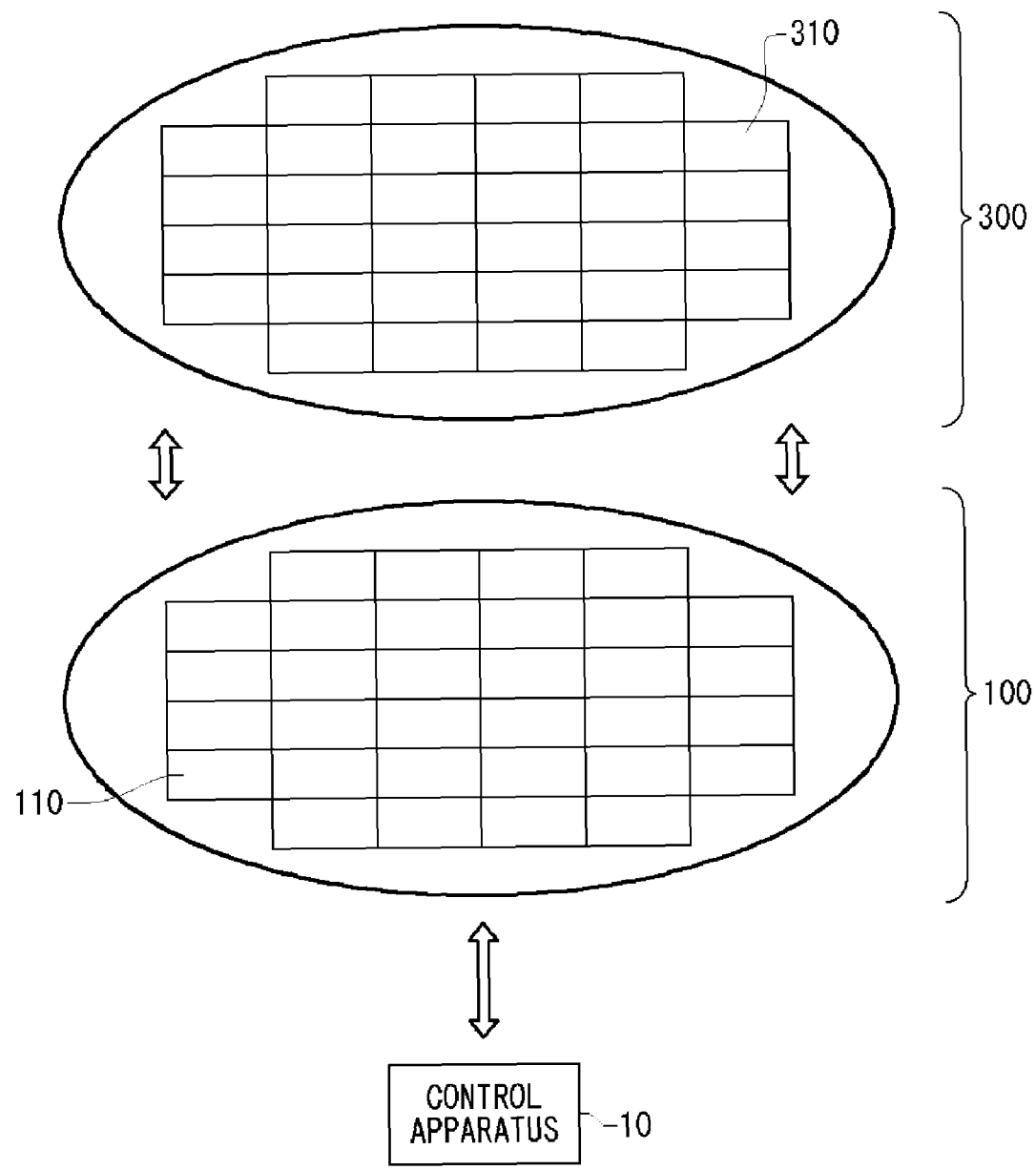
FIG. 1 shows an overview of a test system 400 that tests a plurality of devices under test 310 formed on a wafer under test 300.

FIG. 1 shows an overview of a test system 400. The test system 400 tests a plurality of devices under test 310 formed on a wafer under test 300, and includes a test substrate 100 and a control apparatus 10. FIG. 1 shows an exemplary perspective view of the wafer under test 300 and the test substrate 100.

The wafer under test 300 may be a circular semiconductor substrate. More specifically, the wafer under test 300 may be silicon, a composite semiconductor, or another type of semiconductor substrate. The devices under test 310 may be formed on the wafer under test 300 using a semiconductor process such as lithography.

The test substrate 100 is electrically connected to the wafer under test 300. More specifically, the test substrate 100 is electrically connected en bloc to the plurality of devices under test 310 formed on the wafer under test 300. The test substrate 100 includes a plurality of circuit blocks 110.

The test substrate 100 may be a wafer formed of the same semiconductor material as the wafer under test 300. For example, the test substrate 100 may be a silicon substrate. The test substrate 100 may be formed of a semiconductor material whose thermal expansion coefficient is substantially the same as that of substrate of the wafer under test 300. The test substrate 100 may be a print substrate.

The circuit blocks 110 correspond to the devices under test 310. In the present embodiment, the circuit blocks 110 correspond one-to-one with the devices under test 310. Each circuit block 110 is electrically connected to the corresponding device under test 310 to test this device under test 310.

The test substrate 100 of the present embodiment has substantially the same diameter as the wafer under test 300. Each circuit block 110 may be formed in a region of the test substrate 100 corresponding to a region of the wafer under test 300 where a device under test 310 is formed. For example, the circuit blocks 110 may be formed such that the region in which each circuit block 110 is formed overlaps with the region in which a device under test 310 is formed when the test substrate 100 and the wafer under test 300 are stacked.

The devices under test 310 and the circuit blocks 110 may be provided on surfaces of the wafer under test 300 and the test substrate 100 that face each other. Instead, the circuit blocks 110 may be provided on the back of the surface that faces the wafer under test 300. In this case, each circuit block 110 may be electrically connected to the corresponding device under test 310 through a via hole formed in the test substrate 100.

Here, electrical connection may refer to a state in which electrical signals can be transmitted between two components. For example, input/output pads of the circuit blocks 110 and devices under test 310 may directly contact each other or indirectly contact each other via a conductor to achieve electrical connection. The test system 400 may include a probe member such as a membrane sheet between the wafer under test 300 and the test substrate 100, and this membrane sheet may have substantially the same diameter as the wafer under test 300 and the test substrate 100. This membrane sheet has bumps to create electrical connections between corresponding input/output pads of the circuit blocks 110 and the devices under test 310. The test system 400 may include an anisotropic conductive sheet between the membrane sheet and the test substrate 100.

The input/output pads of the circuit blocks 110 and the devices under test 310 may be electrically connected in a non-contact state using capacitive coupling, also known as electrostatic coupling, or inductive coupling, also known as magnetic coupling. A portion of the transmission lines between the input/output pads of the circuit blocks 110 and the devices under test 310 may be optical transmission lines.

The test substrate 100 of the present embodiment is formed of the same semiconductor material as the wafer under test 300, and therefore the test substrate 100 can maintain a good electrical connection with the wafer under test 300 even when the surrounding temperature fluctuates. Therefore, even if the wafer under test 300 is heated during testing, for example, the wafer under test 300 can be accurately tested.

If the test substrate 100 is formed of a semiconductor material, the circuit blocks 110 can be easily formed on the test substrate 100 with high density. For example, the circuit blocks 110 can be easily formed on the test substrate 100 with high density by using a semiconductor process such as lithography. As a result, a large number of circuit blocks 110 corresponding to a large number of devices under test 310 can be formed relatively easily on the test substrate 100.

When the circuit blocks 110 are provided on the test substrate 100, the size of the control apparatus 10 can be decreased. The control apparatus 10 should have a function to provide notification concerning the timing at which testing of the circuit blocks 110 is begun, a function to read test results of the circuit blocks 110, and a function to supply drive power to the circuit blocks 110 and the devices under test 310, for example.

Figure 2:
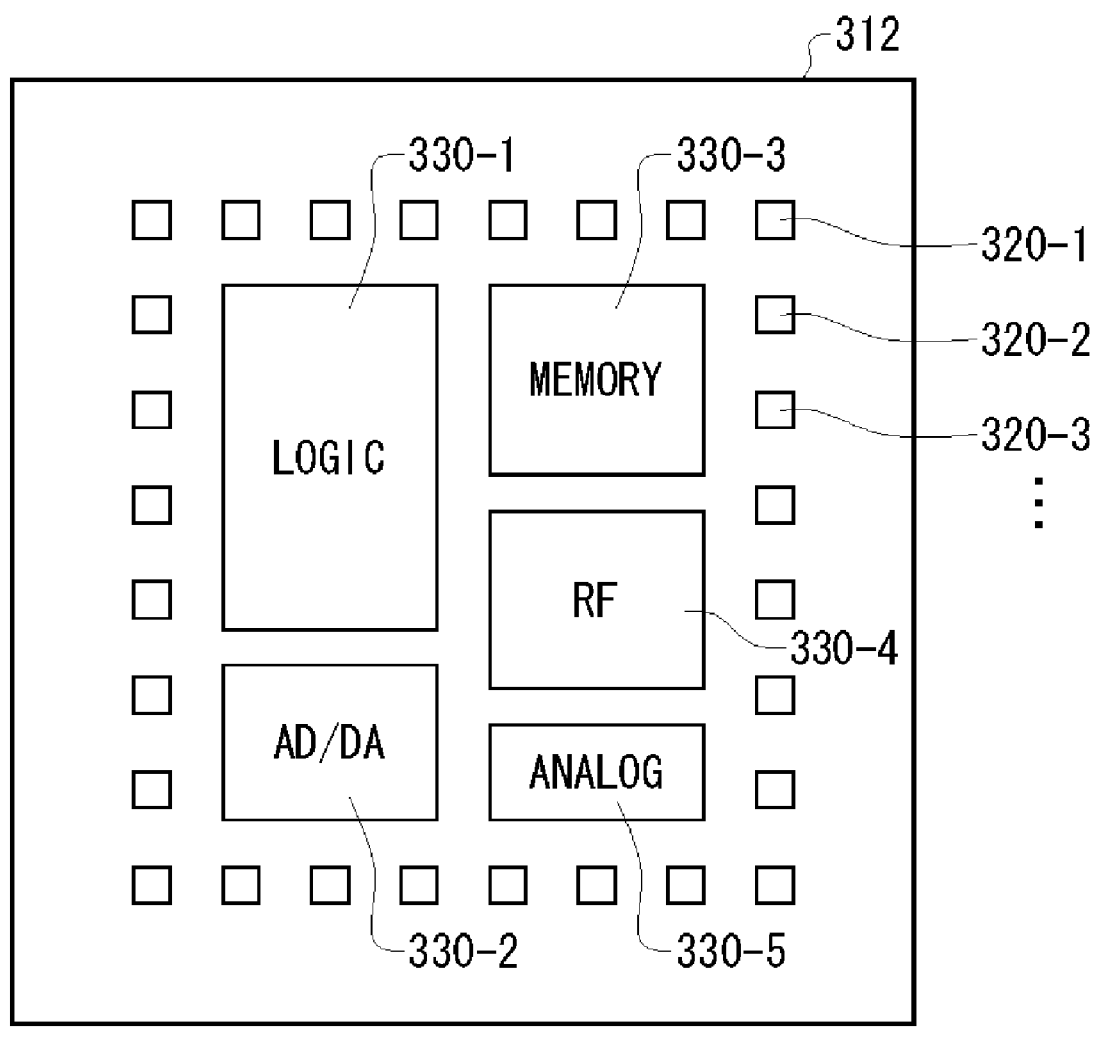
FIG. 2 shows an overview of a device under test 310.

FIG. 2 shows an overview of a device under test 310. The device under test 310 of the present embodiment may be a circuit such as an SOC. The device under test 310 includes a plurality of device pads 320 and a plurality of operation circuits 330.

Each operation circuit 330 may be a logic circuit, an AD/DA conversion circuit, a memory circuit, a high-frequency circuit, an analog circuit, or the like, and each operation circuit 330 has a predetermined function and electrical characteristics. The test substrate 100 described in relation to FIG. 1 tests whether the functions and electrical characteristics of these operation circuits 330 are correct or not.

Each device pad 320 is electrically connected to a predetermined operation circuit 330. Each device pad 320 electrically connects the corresponding operation circuit 330 to an external electric device. The test substrate 100 described in relation to FIG. 1 is electrically connected to the operation circuits 330 via these device pads 320.

The arrangement of the device pads 320 in the devices under test 310 and the functions and arrangement of the operation circuits 330 are not limited to the above description. The device pads 320 and the operation circuits 330 can be arranged at a variety of positions and have a variety of functions depending on the types of devices under test 310.

Figure 3:
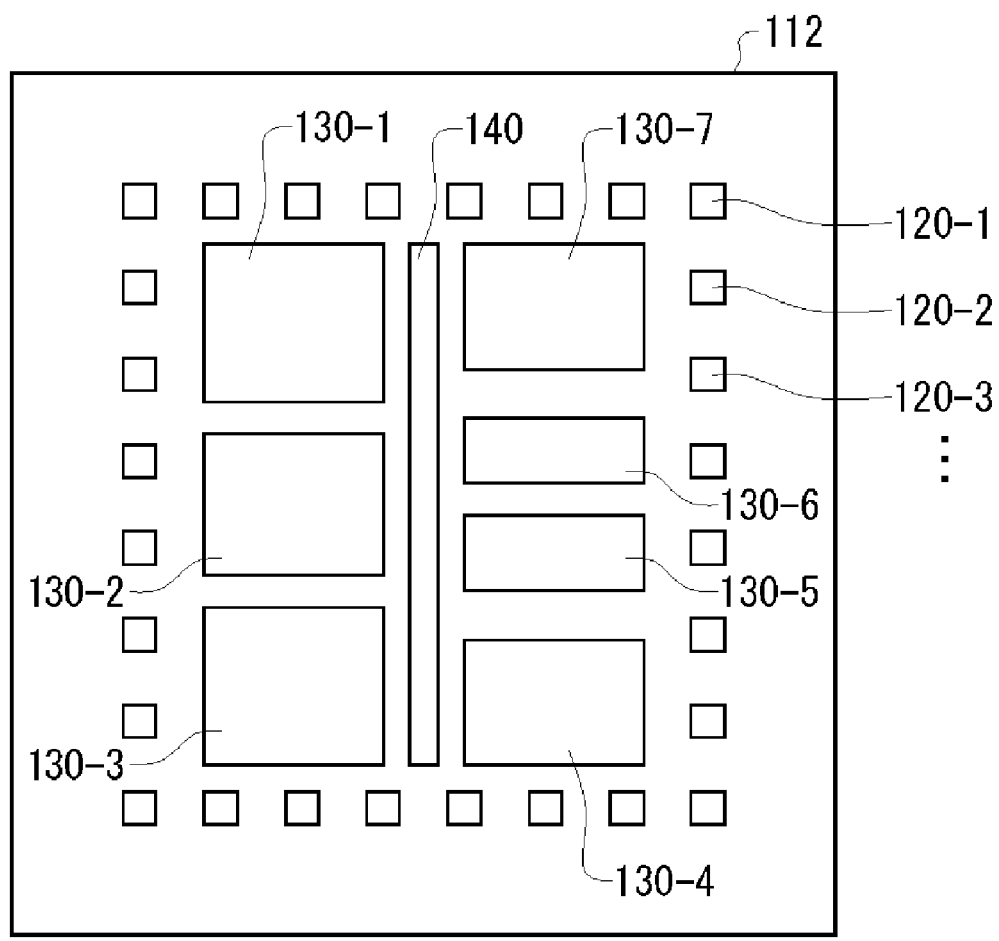
FIG. 3 shows an exemplary configuration of a circuit block 110.

FIG. 3 shows an exemplary configuration of a circuit block 110. Each circuit block 110 is formed in a predetermined individual region 112 of the test substrate 100. As described above, each circuit block 110 may be formed in an individual region 112 of the test substrate 100 at a position corresponding to a device under test 310. Each individual region 112 may be a region that overlaps with a device under test 310 when the test substrate 100 and the wafer under test 300 are stacked. Each circuit block 110 may have the same circuit configuration.

The circuit block 110 includes a plurality of test pads 120, a plurality of test circuits 130, and a bus control circuit block 140. The test pads 120 are formed at positions corresponding to the device pads 320 of the corresponding device under test 310. For example, the test pads 120 may be formed at positions overlapping with the device pads 320 when the test substrate 100 and the wafer under test 300 are stacked.

A plurality of types of test circuits 130 are formed on the circuit block 110. For example, a plurality of types of test circuits 130 corresponding to the plurality of types of operation circuits 330 of the device under test 310 may be formed on the circuit block 110. More specifically, types of test circuits 130 that can generate test signals to be supplied to the types of operation circuits 330 are formed on the circuit block 110.

Each test circuit 130 is electrically connected to the corresponding operation circuit 330 via a test pad 120. For example, a test circuit 130 that generates a digital signal may be connected to the operation circuit 330 that has a logic circuit and a test circuit 130 that generates a high-frequency signal may be connected to the operation circuit 330 that has a high-frequency circuit.

Each test circuit 130 may be electrically connected to the control apparatus 10 via the bus control circuit block 140. The control apparatus 10 may supply a control signal for controlling each test circuit 130. For example, the control apparatus 10 may supply each test circuit 130 with a signal to begin testing in synchronization. The bus control circuit block 140 may include a bus line for exchanging signals with each test circuit 130 and a decoder, encoder, register, and the like for controlling this bus line.

By using test circuits 130 having functions corresponding to the circuit configuration of the device under test 310 in this way, the circuit size of the test circuit 130 can be made smaller than if a general test circuit were provided for each pin. As a result, the test circuits 130 can be formed on a test substrate 100 having substantially the same surface area as the wafer under test 300. By stacking the test substrate 100 on the wafer under test 300, the signal transmission distance for the test signals can be shortened to enable accurate testing of the devices under test 310.

Figure 4:
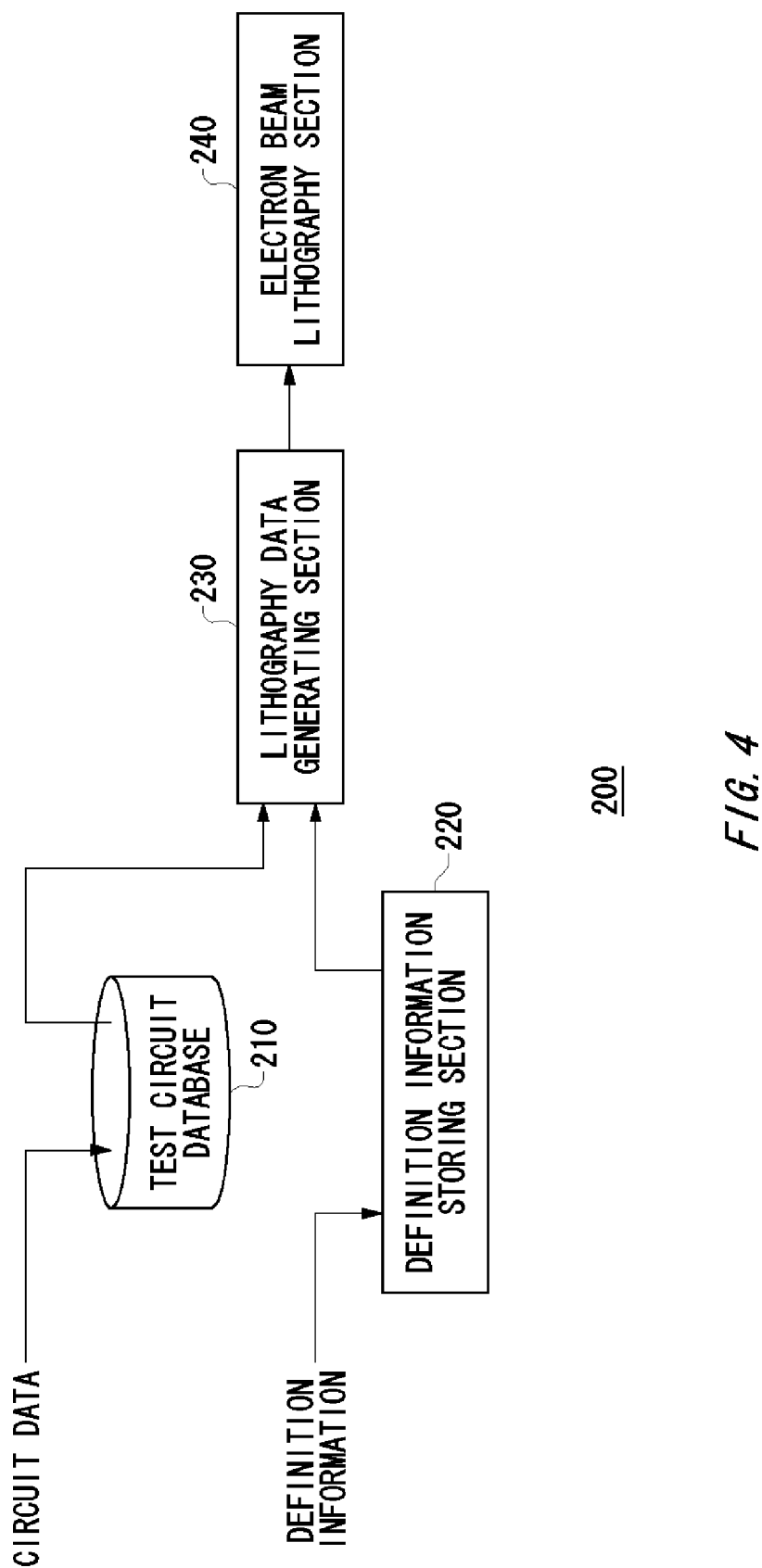
FIG. 4 is a block diagram showing an exemplary functional configuration of a test substrate manufacturing apparatus 200 for manufacturing a test substrate 100.

FIG. 4 is a block diagram showing an exemplary functional configuration of a test substrate manufacturing apparatus 200 for manufacturing a test substrate 100. The test substrate manufacturing apparatus 200 manufactures a test substrate 100 corresponding to the circuit configuration of a device under test 310, such as the test substrate 100 described in relation to FIGS. 1 to 3, and includes a test circuit database 210, a definition information storing section 220, a lithography data generating section 230, and an electron beam lithography device 240. The test substrate 100 of the present embodiment may be a semiconductor wafer.

The test circuit database 210 stores circuit data for a plurality of types of test circuits 130, in association with a plurality of types of testing content for testing a plurality of types of operation circuits 330. For example, the test circuit database 210 may store circuit data for test circuits 130 that test operation circuits 330 including a logic circuit, an AD/DA conversion circuit, a memory circuit, a high-frequency circuit, and an analog circuit.

The test circuit database 210 may store circuit data provided by a user or the like. The test circuit database 210 may store each piece of circuit data in association with information indicating testing content performed by a test circuit 130.

The circuit data may include arrangement data for the circuit elements of the test circuits 130 and manufacturing data used when manufacturing the test circuits 130. The manufacturing data may include data concerning lithography patterns, etching conditions, impurity concentration to be input to semiconductor layers, or the like. The following describes an example in which the test circuit database 210 stores circuit data including a lithography pattern for each test circuit 130.

The definition information storing section 220 stores definition information that defines the arrangement of the devices under test 310 and device pads 320 and the testing content to be performed for each device pad 320. The definition information storing section 220 may store definition information provided by a user or the like. The definition information may include information that defines which operation circuit 330 each device pad 320 is electrically connected to.

The definition information storing section 220 may store definition information that includes information that associates data identifying each device pad 320 with a lithography pattern stored in the test circuit database 210. In this case, the lithography data generating section 230 extracts, from the test circuit database 210, a lithography pattern designated by the definition information stored in the definition information storing section 220.

The definition information storing section 220 may store definition information that includes information associating data identifying each device pad 320 with testing content for the device pad 320. In this case, the lithography data generating section 230 detects the testing content for each device pad 320 based on the definition information stored in the definition information storing section 220, and extracts the lithography pattern corresponding to the detected testing content from the test circuit database 210.

The lithography data generating section 230 generates lithography data for forming each circuit block 110 of the test substrate 100 using lithography. This lithography data may include a plurality of lithography patterns corresponding to a plurality of circuits. As described above, each circuit block 110 is formed in a lithography region corresponding to a device under test 310. Therefore, the lithography data generating section 230 generates lithography data, for forming the circuit blocks 110 using lithography, for these lithography regions. As described in FIG. 3, the lithography data generating section 230 forms circuit blocks 110 having a plurality of types of test circuits 130 in the individual regions 112 of the test substrate 100.

The lithography data generating section 230 may generate lithography data for forming identical circuit blocks 110 in the individual regions 112. The following describes an exemplary method for generating lithography data for a single circuit block 110.

The lithography data generating section 230 selects from the test circuit database 210 lithography patterns of the test circuits 130 of the circuit block 110 to be connected to the device pads 320, based on the definition information stored in the definition information storing section 220. As described above, the definition information may include information that associates data identifying each device pad 320 with a lithography pattern stored in the test circuit database 210.

The lithography data generating section 230 generates the lithography data for the test substrate 100 by determining positions on the test substrate 100 where the lithography patterns selected from the test circuit database 210 are to be applied, based on the arrangement of the device pads 320 as defined by the definition information stored in the definition information storing section 220. For example, the lithography data generating section 230 may generate lithography data that arranges the lithography patterns such that each test circuit 130 is formed near the corresponding test pad 120.

The electron beam lithography device 240 may manufacture the test substrate 100 by performing electron beam lithography on a semiconductor wafer based in the lithography data generated by the lithography data generating section 230. In addition to the configuration shown in FIG. 4, the test substrate manufacturing apparatus 200 may include a semiconductor process apparatus, such as an etching apparatus that etches a semiconductor wafer on which electron beam lithography is performed using the electron beam lithography device 240.

The lithography data generating section 230 of the present embodiment generates the lithography data to be used by the electron beam lithography device 240. The test circuit database 210 of the present embodiment stores the lithography patterns to be used when performing electron beam lithography on the test circuits 130. With this configuration, the electron beam lithography device 240 can be used to manufacture the test substrate 100 as described above.

Usually, the electron beam lithography device 240 directly draws the lithography pattern on the semiconductor wafer by scanning an electron beam on the semiconductor wafer. Therefore, a variety of lithography patterns can be drawn with an optical lithography device without using a mask corresponding to the lithography pattern. Therefore, the test substrate manufacturing apparatus 200 can easily manufacture a test substrate 100 corresponding to the type of the wafer under test 300. The test substrate manufacturing apparatus 200 may include, instead of the electron beam lithography device 240, a lithography device that directly draws lithography patterns on the semiconductor wafer by scanning the semiconductor wafer using a method other than electron beam scanning.

The test substrate manufacturing apparatus 200 forms the circuit blocks 110 having the same circuit configurations in the individual regions 112 of the test substrate 100. Therefore, the electron beam lithography device 240 may use lithography to form the circuit blocks 110 in the plurality of individual regions 112 in parallel by generating a plurality of electron beams corresponding to the individual regions 112 of the test substrate 100 in parallel and using common lithography data to scan with the electron beams. In this case, the lithography data generating section 230 may supply the electron beam lithography device 240 with lithography data corresponding to a single circuit block 110. With this configuration, the lithography efficiency of the electron beam lithography device 240 can be improved.

If the test substrate 100 is a print substrate, circuit chips including the circuit blocks 110 may be implemented on the test substrate 100 for each device under test 310. These circuit chips may be bare chips that are not packaged. In this case, the test substrate manufacturing apparatus 200 may manufacture a plurality of circuit chips including circuit blocks 110. The circuit blocks 110 may be disposed on the surface of the test substrate 100 facing the wafer under test 300, or may be disposed on the back of the surface facing the wafer under test 300.

Figure 5:
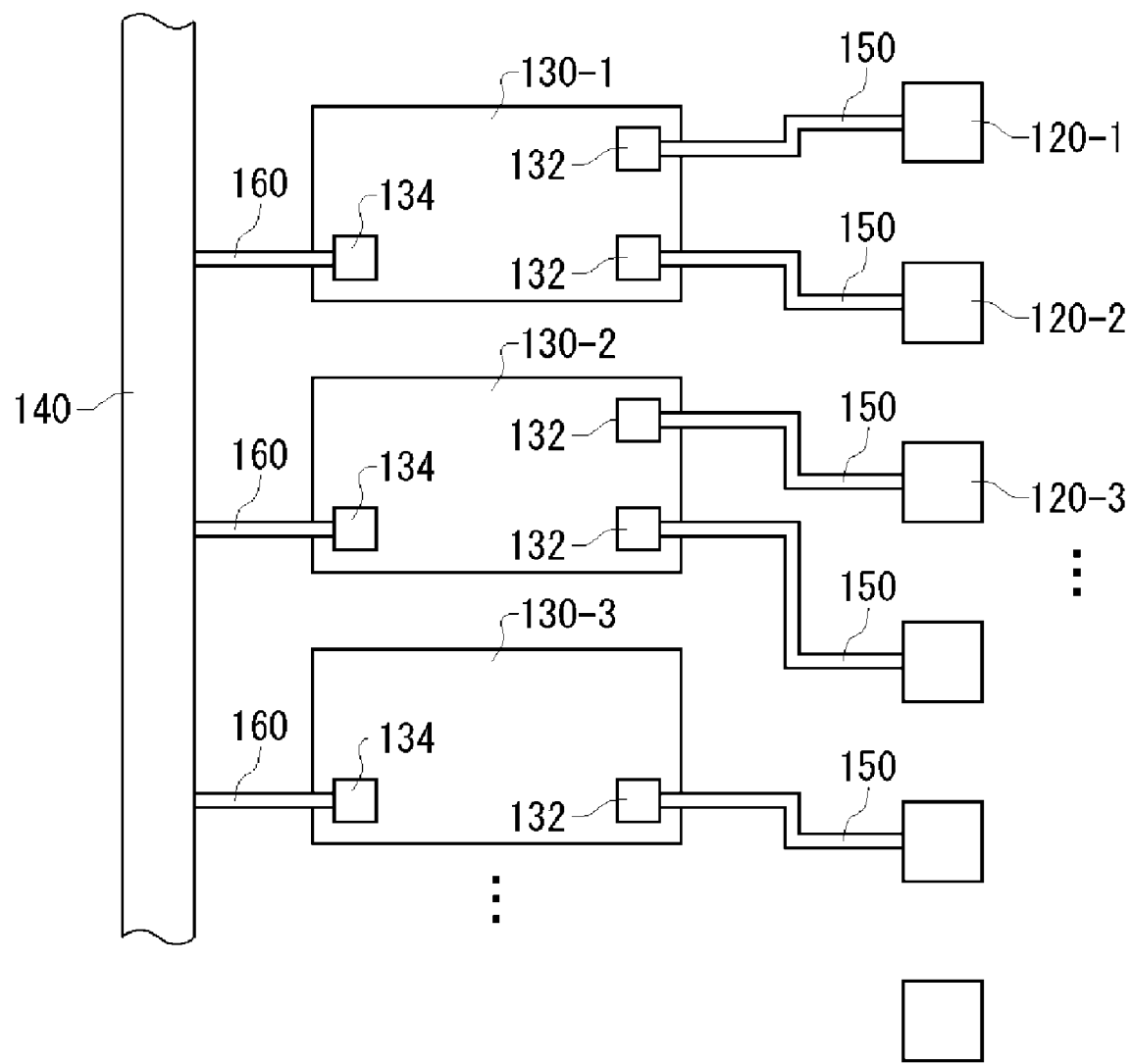
FIG. 5 shows a detailed exemplary configuration of a circuit block 110.

FIG. 5 shows a detailed exemplary configuration of a circuit block 110. As described in relation to FIG. 3, the circuit block 110 includes a plurality of test circuits 130, a plurality of test pads 120, a bus control circuit block 140, a plurality of pad connection lines 150, and a plurality of bus connection lines 160. The test pads 120 are formed in the individual regions 112 of the circuit block 110 at positions corresponding to the device pads 320 of the device under test 310.

Each pad connection line 150 is formed to electrically connect a test circuit 130, which is to be connected to a corresponding device pad 320, to a test pad 120. For example, each pad connection line 150 exchanges signals between a test circuit 130 and the device under test 310 by electrically connecting a test pad 120 to an input/output terminal 132 of a test circuit 130. The test circuit 130 to be connected to each test pad 120 can be determined by the testing content and arrangement of the device pads 320 in the definition information stored in the definition information storing section 220.

For example, the test circuit 130 to be connected to each device pad 320 may be determined based on the testing content of each device pad 320, as defined by the definition information. The wiring patterns of the pad connection lines 150 that connect the test circuits 130 to the corresponding test pads 120 can be determined based on the arrangement of the device pads 320 and the arrangement of the test circuits 130. For example, the lithography data generating section 230 may determine the wiring patterns of the pad connection lines 150 in a manner to connect the input/output terminals 132 of the test circuits 130 to the corresponding test pads 120.

The lithography data generating section 230 may generate the lithography data to include, in addition to the lithography patterns of the test circuits 130, lithography patterns of the pad connection lines 150. In this case, the lithography data generating section 230 detects the arrangements of the device pads 320 and the testing content for the device pads 320, as defined by the definition information stored in the definition information storing section 220. The lithography data generating section 230 may generate the lithography patterns of the pad connection lines 150, based on the positions at which lithography is used to form test circuits 130 having the functions corresponding to the detected testing content and the positions of the test pads 120 corresponding to the device pads 320.

The lithography data generating section 230 may generate, in addition to the lithography patterns of the test circuits 130 and pad connection lines 150, lithography patterns for the test pads 120. The lithography pattern of each test pad 120 can be generated based on the arrangement of the device pads 320 as defined by the definition information stored in the definition information storing section 220. The lithography data generating section 230 may generate the lithography patterns for forming the test pads 120 with an arrangement identical to that of the device pads 320.

Each bus connection line 160 electrically connects a test circuit 130 to the bus control circuit block 140. For example, the bus connection lines 160 may electrically connect control terminals 134 of the test circuits 130 to the bus control circuit block 140. The lithography data generating section 230 may further generate lithography patterns of the bus connection lines 160 in the individual regions 112 where the circuit blocks 110 are formed. The lithography data generating section 230 may generate the lithography patterns of the bus connection lines 160 for connecting the bus control circuit block 140 and the control terminals 134 based on the positions of the bus control circuit blocks 140 and the positions of the control terminals 134 in the test circuits 130.

The lithography data generating section 230 may further generate lithography patterns of the bus control circuit blocks 140 in the individual regions 112 where the circuit blocks 110 are formed. The lithography data generating section 230 may generate the lithography patterns for forming the bus control circuit blocks 140 at predetermined positions in the individual regions 112.

Figure 6:
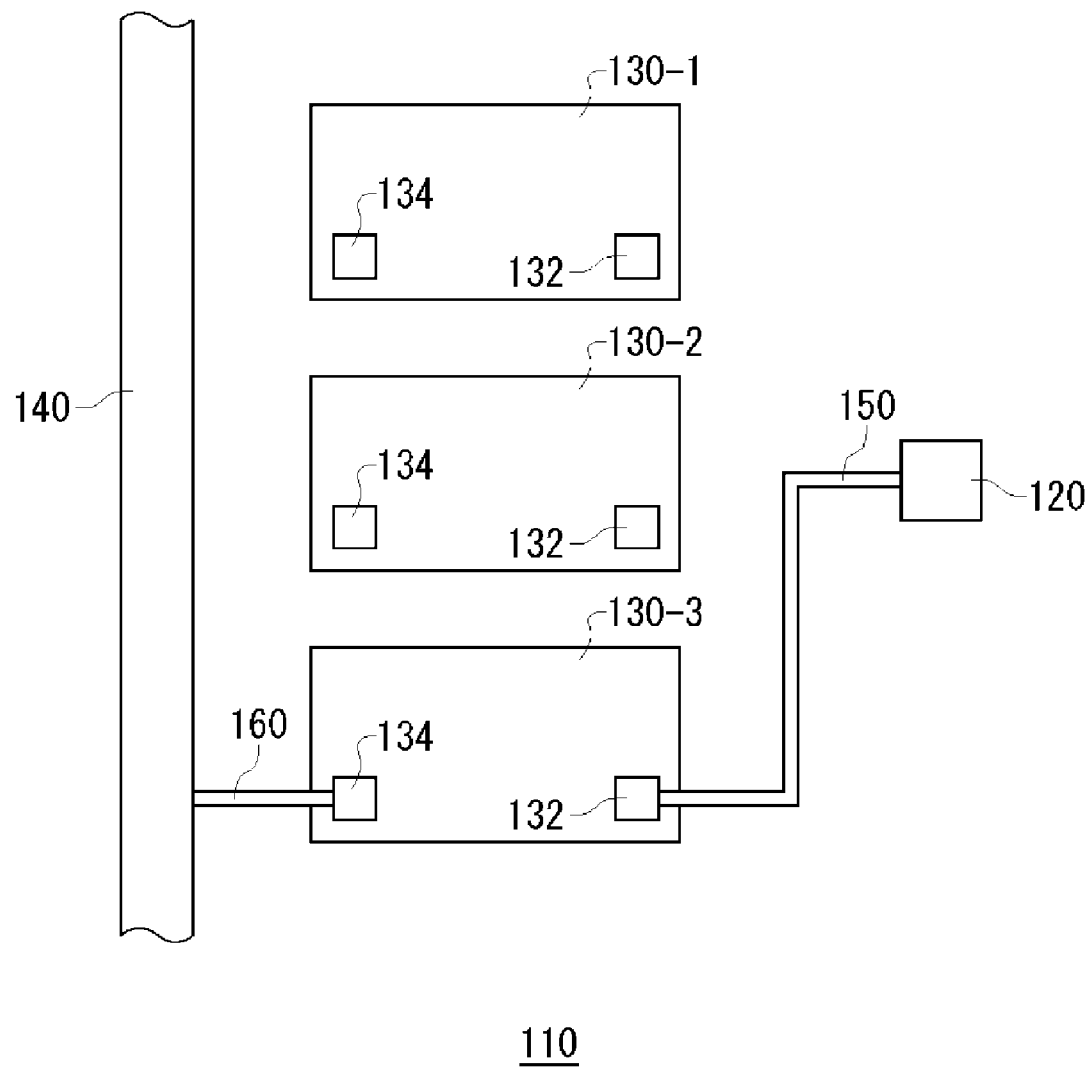
FIG. 6 is a view for describing another method for forming the circuit blocks 110.

FIG. 6 is a view for describing another method for forming the circuit blocks 110. In the present embodiment, the bus control circuit block 140, the test circuits 130, and the test pads 120 are formed in advance using optical lithography. The pad connection lines 150 and the bus connection lines 160 are formed using electron beam lithography.

The test substrate manufacturing apparatus 200 may form a plurality of types of test circuits 130 in advance for each test pad 120, using optical lithography with a mask. The test substrate manufacturing apparatus 200 then selects the test circuit 130 to be connected to the test pad 120 based on the definition information stored in the definition information storing section 220, and uses electron beam lithography to form a pad connection line 150 that electrically connects the test pad 120 to the corresponding test circuit 130. Furthermore, the test substrate manufacturing apparatus 200 may use electron beam lithography to form a bus connection line 160 that electrically connects the selected test circuit 130 to the bus control circuit block 140. The lithography data generating section 230 may be provided in advance with the position of the bus control circuit block 140 and the positions of the test circuits 130.

With this configuration, a plurality of types of test substrates 100 corresponding to a plurality of types of wafers under test 300 can be easily manufactured. In other words, by using optical lithography to form the bus control circuit block 140, the test circuits 130, and the test pads 120, these circuit elements can be formed in a short time. Furthermore, by using electron beam lithography to form the bus connection lines 160 and the pad connection lines 150, a plurality of types of test substrates 100 can be manufactured without using a plurality of types of masks. Therefore, a plurality of types of test substrates 100 can be manufactured at a low cost and in a short time. The electron beam lithography device 240 may use a common lithography pattern to form pad connection lines 150 in parallel in the individual regions 112.

Figure 7:
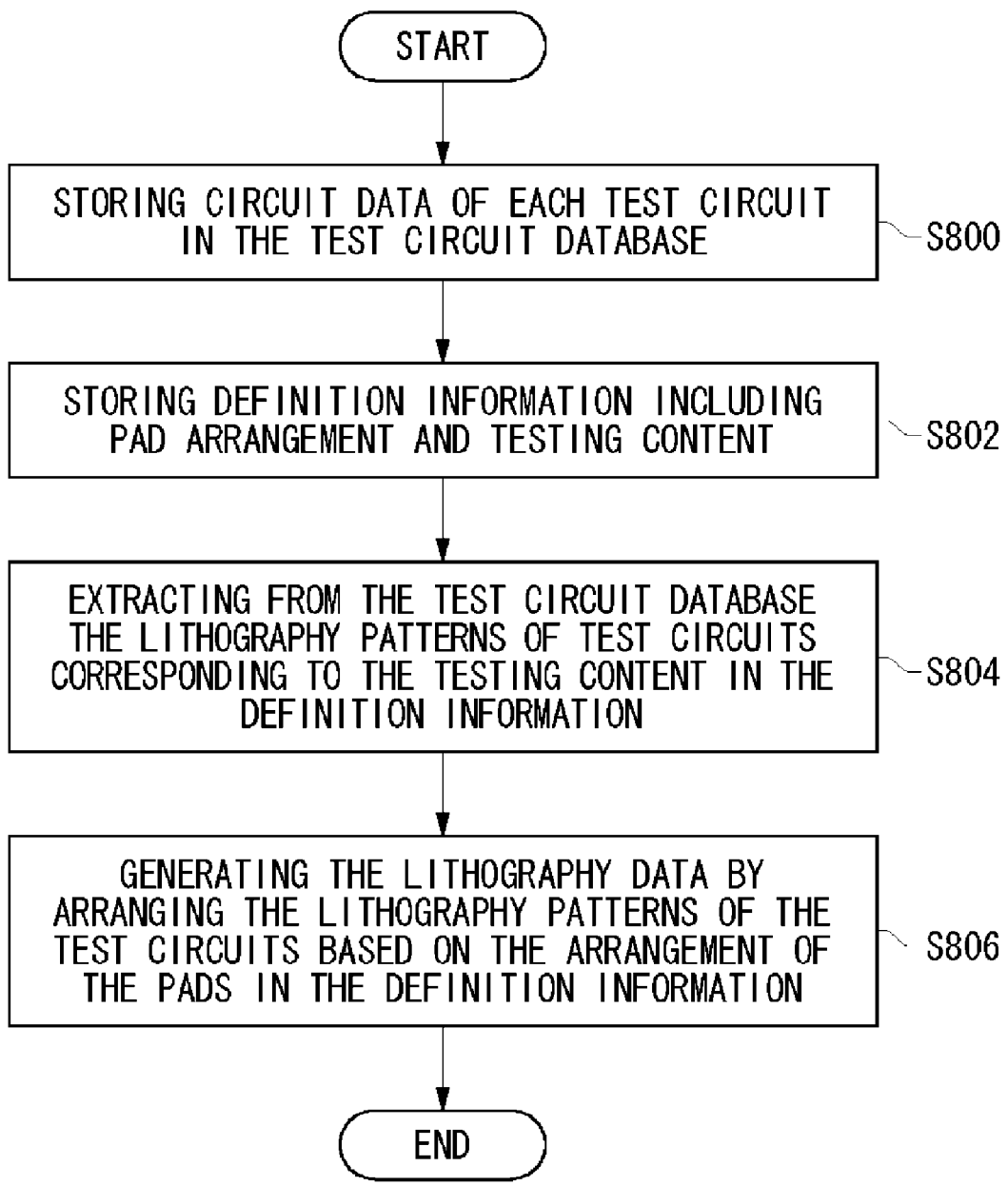
FIG. 7 is a flow chart showing an overview of a method for manufacturing a test substrate.

FIG. 7 is a flow chart showing an overview of a method for manufacturing a test substrate. The method for manufacturing a test substrate according to the present embodiment involves manufacturing a test substrate 100 using the same method as used by the test substrate manufacturing apparatus 200 described in relation to FIGS. 1 to 6.

First, circuit data for each test circuit 130 is stored in the test circuit database 210 (S800). New circuit data may be sequentially accumulated in the test circuit database 210. The definition information defining the arrangement of the device pads 320 and the testing content corresponding to each device pad 320 is stored in the definition information storing section 220 (S802). The definition information of the definition information storing section 220 may be overwritten with new definition information prior to testing of the wafer under test 300.

Next, lithography patterns of the test circuits 130 corresponding to the testing content defined by the definition information stored in the definition information storing section 220 are extracted from the test circuit database 210 (S804). The lithography data is then generated by arranging the lithography patterns of the test circuits 130 based on the arrangement of the device pads 320 in the definition information stored in the definition information storing section 220 (S806).

Figure 8:
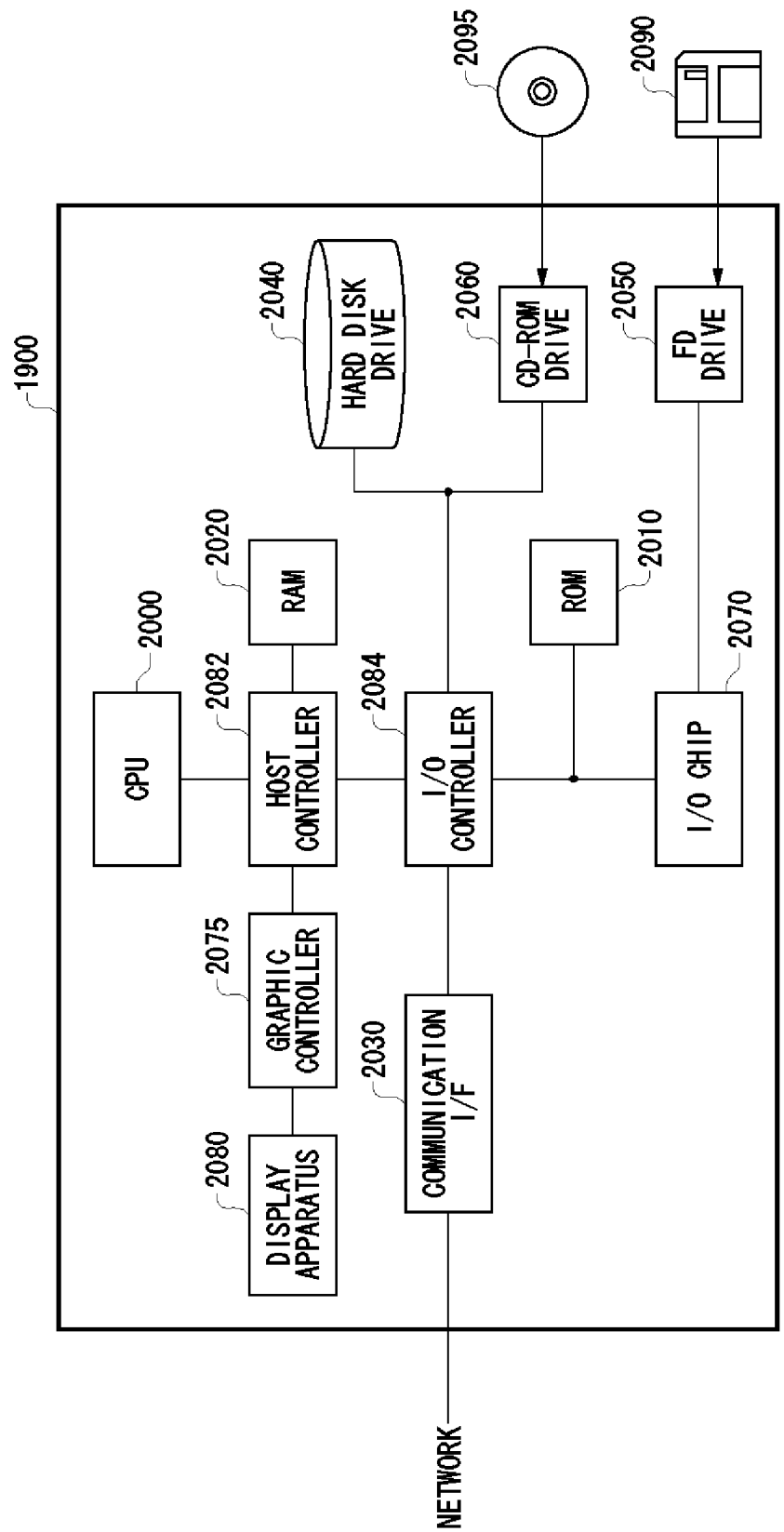
FIG. 8 shows an exemplary configuration of a computer 1900.

FIG. 8 shows an exemplary configuration of a computer 1900. The computer 1900 may function as a portion of the test substrate manufacturing apparatus 200 described in relation to FIGS. 1 to 6, based on a program provided thereto. For example, the computer 1900 may function as a design supporting apparatus that includes the test circuit database 210, the definition information storing section 220, and the lithography data generating section 230 of the test substrate manufacturing apparatus 200. The computer 1900 may control the test substrate manufacturing apparatus 200 to function as described in relation to FIGS. 1 to 6. The computer 1900 may control the electron beam lithography device 240 as described in relation to FIGS. 1 to 6.

The program provided to the computer 1900 may cause the computer 1900 to function as a portion of the test substrate manufacturing apparatus 200. This program may cause the computer 1900 to control a portion of the test substrate manufacturing apparatus 200.

The computer 1900 according to the present embodiment is provided with a CPU peripheral, an input/output section, and a legacy input/output section. The CPU peripheral includes a CPU 2000, a RAM 2020, a graphic controller 2075, and a display apparatus 2080, all of which are connected to each other by a host controller 2082. The input/output section includes a communication interface 2030, a hard disk drive 2040, and a CD-ROM drive 2060, all of which are connected to the host controller 2082 by an input/output controller 2084. The legacy input/output section includes a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. Instead, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020. The hard disk drive 2040 may function as the test circuit database 210 and the definition information storing section 220.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000. The CPU 2000 may function as the lithography data generating section.

The programs are installed in the computer 1900. The programs prompt the CPU 2000 or the like to make the computer 1900 function as a portion of the test substrate manufacturing apparatus 200.

The programs shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test substrate manufacturing apparatus for manufacturing a test substrate that tests a plurality of devices under test formed on a wafer under test, a method for manufacturing the test substrate, and a recording medium that stores a program causing the test substrate manufacturing apparatus to function.

What is claimed is:

1. A test substrate manufacturing apparatus for manufacturing a test substrate on which are formed a plurality of test circuits that test a plurality of devices under test formed on a wafer under test, the test substrate manufacturing apparatus comprising:
   a test circuit database that stores circuit data of the plurality of test circuits in association with a plurality of types of testing content;
   a definition information storing section that stores definition information defining arrangements of device pads of the devices under test and testing content to be performed for each of the device pads; and
   a lithography data generating section that generates lithography data for the test substrate by (i) selecting, from the test circuit database, circuit data of each test circuit to be connected to a device pad based on the testing content defined by the definition information stored in the definition information storing section and (ii) determining positions on the test substrate where the test circuits corresponding to the selected circuit data are formed using lithography, based on the arrangements of the device pads as defined by the definition information, wherein
   the test substrate includes a plurality of individual regions corresponding to the devices under test,
   circuit blocks are formed in the individual regions, each of the circuit blocks including:
      a plurality of the test circuits; and
      a plurality of test pads formed at positions corresponding to the device pads of a corresponding device under test.

2. The test substrate manufacturing apparatus according to claim 1, wherein
   the test substrate manufacturing apparatus manufactures the test substrate to have substantially the same diameter as the wafer under test, and
   the lithography data generating section generates lithography data, which is for forming lithographic regions of the test substrate, using lithography, that correspond to regions where the devices under test of the wafer under test are formed.

3. The test substrate manufacturing apparatus according to claim 2, wherein
   the lithography data generating section generates the lithography data for forming, in the lithographic regions of the test substrate, circuit blocks that have a plurality of types of the test circuits in individual regions corresponding to the devices under test.

4. The test substrate manufacturing apparatus according to claim 3, wherein
   the lithography data generating section generates the lithography data for forming the same circuit block in each individual region.

5. The test substrate manufacturing apparatus according to claim 4, wherein
   a plurality of test pads are formed in each individual region at positions corresponding to a plurality of device pads of corresponding devices under test, and
   the lithography data generating section detects the testing content and arrangement of the device pads defined by the definition information stored in the definition information storing section, and generates the lithography data for further forming, using lithography, connection wiring for electrically connecting the test circuits to test pads corresponding to the device pads, based on positions where test circuits corresponding to the testing content are formed using lithography.

6. The test substrate manufacturing apparatus according to claim 5, wherein
the lithography data generating section generates the lithography data for further forming with lithography, in each individual region, a bus control circuit block that is electrically connected to a plurality of the test circuits.

7. The test substrate manufacturing apparatus according to claim 2, wherein
the lithography data generating section generates the lithography data to be used for electron beam lithography, and
the test substrate manufacturing apparatus further comprises an electron beam lithography device that manufactures the test substrate by performing electron beam lithography on a semiconductor wafer based on the lithography data generated by the lithography data generating section.

8. The test substrate manufacturing apparatus according to claim 7, wherein
the lithography data generating section generates, as the lithography data, control data for controlling the electron beam lithography device.

9. The test substrate manufacturing apparatus according to claim 1, wherein
the test substrate includes a plurality of individual regions corresponding to the devices under test,
a plurality of test pads are formed in each individual region at positions corresponding to a plurality of device pads of corresponding devices under test, and
the lithography data generating section detects the testing content and arrangement of the device pads defined by the definition information stored in the definition information storing section, and generates the lithography data for further forming, using lithography, connection wiring for electrically connecting the test circuits to test pads corresponding to the device pads, based on positions where test circuits corresponding to the testing content are formed using lithography.

10. The test substrate manufacturing apparatus according to claim 1, wherein
the test substrate includes a plurality of individual regions corresponding to the devices under test, and
the lithography data generating section generates the lithography data for further forming with lithography, in each individual region, a bus control circuit block that is electrically connected to a plurality of the test circuits.

11. A method for manufacturing a test substrate on which are formed a plurality of test circuits that test a plurality of devices under test formed on a wafer under test, the method comprising:
storing, in a test circuit database, circuit data of the plurality of test circuits in association with a plurality of types of testing content;
storing, in a definition information storing section, definition information defining arrangements of device pads of the devices under test and testing content to be performed for each of the device pads;
generating lithography data for the test substrate by (i) selecting, from the test circuit database, circuit data of each test circuit to be connected to a device pad based on the testing content defined by the definition information stored in the definition information storing section and (ii) determining positions on the test substrate where the test circuits corresponding to the selected circuit data are formed using lithography, based on the arrangements of the device pads as defined by the definition information;
manufacturing the test substrate by performing electron beam lithography on a semiconductor wafer based on the generated lithography data; and
forming circuit blocks in individual regions of the test substrate corresponding to the devices under test, each of the circuit blocks including a plurality of test circuits and a plurality of test pads formed at positions corresponding to the device pads of a corresponding device under test.

12. The method according to claim 11, further comprising:
forming a plurality of test pads in each of a plurality of individual regions of the test substrate corresponding to the devices under test, at positions corresponding to a plurality of device pads of corresponding devices under test; and
detecting the testing content and arrangement of the device pads defined by the definition information stored in the definition information storing section, and generating the lithography data for further forming, using lithography, connection wiring for electrically connecting the test circuits to test pads corresponding to the device pads, based on positions where test circuits corresponding to the testing content are formed using lithography.

13. The method according to claim 11, further comprising:
generating the lithography data for further forming with lithography, in each of a plurality of individual regions of the test substrate corresponding to the devices under test, a bus control circuit block that is electrically connected to a plurality of the test circuits.

14. A recording medium storing thereon a program that causes a computer to function as a test substrate manufacturing apparatus for manufacturing a test substrate on which are formed a plurality of test circuits that test a plurality of devices under test formed on a wafer under test, the program causing the computer to function as:
a test circuit database that stores circuit data of the plurality of test circuits in association with a plurality of types of testing content;
a definition information storing section that stores definition information defining arrangements of device pads of the devices under test and testing content to be performed for each of the device pads; and
a lithography data generating section that generates lithography data for the test substrate by (i) selecting, from the test circuit database, circuit data of each test circuit to be connected to a device pad based on the testing content defined by the definition information stored in the definition information storing section and (ii) determining positions on the test substrate where the test circuits corresponding to the selected circuit data are formed using lithography, based on the arrangements of the device pads as defined by the definition information, wherein
the test substrate includes a plurality of individual regions corresponding to the devices under test,
circuit blocks are formed in the individual regions, each of the circuit blocks including:
a plurality of the test circuits; and
a plurality of test pads formed at positions corresponding to the device pads of a corresponding device under test.

15. The recording medium according to claim 14, wherein
the test substrate includes a plurality of individual regions corresponding to the devices under test, a plurality of test pads are formed in each individual region at positions corresponding to a plurality of device pads of corresponding devices under test, and the program further causes the computer to enable
the lithography data generating section to detect the testing content and arrangement of the device pads defined by the definition information stored in the definition information storing section, and generate the lithography data for further forming, using lithography, connection wiring for electrically connecting the test circuits to test pads corresponding to the device pads, based on positions where test circuits corresponding to the testing content are formed using lithography.

16. The recording medium according to claim 14, wherein the test substrate includes a plurality of individual regions corresponding to the devices under test, and the program further causes the computer to enable
the lithography data generating section to generate the lithography data for further forming with lithography, in each individual region, a bus control circuit block that is electrically connected to a plurality of the test circuits.

* * * * *